US008950892B2

(12) United States Patent
Cash (10) Patent No.: US 8,950,892 B2
(45) Date of Patent: Feb. 10, 2015

(54) METHODS FOR COMBINING LIGHT EMITTING DEVICES IN A WHITE LIGHT EMITTING APPARATUS THAT MIMICS INCANDESCENT DIMMING CHARACTERISTICS AND SOLID STATE LIGHTING APPARATUS FOR GENERAL ILLUMINATION THAT MIMIC INCANDESCENT DIMMING CHARACTERISTICS (75) Inventor: Mark Charles Cash, Raleigh, NC (US)

(73) Assignee: Cree, Inc., Durham, NC (US)

( * ) Notice: Subject to any disclaimer, the term of this patent is extended or adjusted under 35 U.S.C. 154(b) by 429 days.

(21) Appl. No.: 13/050,110

(22) Filed: Mar. 17, 2011

(65) Prior Publication Data
US 2012/0236553 A1    Sep. 20, 2012

(51) Int. Cl.
F21V 29/00    (2006.01)
F21V 9/10     (2006.01)
H05K 3/30     (2006.01)

(52) U.S. Cl.
CPC ... *F21V 9/10* (2013.01); *H05K 3/30* (2013.01)
USPC ...................................................... 362/231

(58) Field of Classification Search
USPC ............ 362/249.02, 244, 240, 235, 227, 231
See application file for complete search history.

(56) References Cited

U.S. PATENT DOCUMENTS

| | | |
|---|---|---|
| 5,334,916 A | 8/1994 | Noguchi |
| 5,598,068 A | 1/1997 | Shirai |
| 5,803,579 A | 9/1998 | Turnbull et al. |
| 5,929,568 A | 7/1999 | Eggers |

(Continued)

FOREIGN PATENT DOCUMENTS

| | | |
|---|---|---|
| EP | 1 594 348 A2 | 11/2005 |
| JP | 2003-273404 A | 9/2003 |

(Continued)

OTHER PUBLICATIONS

American National Standard: for electric lamps—"Specifications for the Chromaticity of Solid State Lighting Products" 2008 ANSI_NEMA_ANSLG C78.377-2008. (retrieved on Jun. 8, 2011). Retrieved from the internet: http://www.ledart.ru/files/img/C78.377-2008.pdf.

(Continued)

*Primary Examiner* — Anh Mai
*Assistant Examiner* — Brenitra M Lee
(74) *Attorney, Agent, or Firm* — Myers Bigel Sibley & Sajovec, P.A.

(57) ABSTRACT

A light emitting apparatus includes a first light emitting device configured to emit light having a first chromaticity point that falls within a region on a 1931 CIE Chromaticity Diagram defined by points having coordinates (0.32, 0.40), (0.36, 0.48), (0.43, 0.45), (0.42, 0.42), (0.36, 0.38), and at least two second light emitting devices, each of the at least two second light emitting devices emits light having a respective second chromaticity points that that have ccx values greater than 0.4077 and ccy values less than 0.3944 on the 1931 CIE Chromaticity Diagram. A combined light emitted by the first light emitting device and the at least two second light emitting devices has a third chromaticity point that falls within a 7-step MacAdam ellipse around a point on the black body locus having a correlated color temperature between 2700K and 6500K. The third chromaticity may shift to a more reddish chromaticity when power supplied to the light emitting devices is decreased.

15 Claims, 8 Drawing Sheets

(56) References Cited

U.S. PATENT DOCUMENTS

| | | |
|---|---|---|
| 6,441,558 B1 | 8/2002 | Muthu et al. |
| 6,498,440 B2 | 12/2002 | Stam et al. |
| 6,636,003 B2 | 10/2003 | Rahm et al. |
| 6,697,130 B2 | 2/2004 | Weindorf et al. |
| 6,753,661 B2 | 6/2004 | Muthu et al. |
| 6,784,622 B2 | 8/2004 | Newman, Jr. et al. |
| 6,788,011 B2 | 9/2004 | Mueller et al. |
| 6,885,035 B2 | 4/2005 | Bhat et al. |
| 6,998,594 B2 | 2/2006 | Gaines et al. |
| 7,038,399 B2 | 5/2006 | Lys et al. |
| 7,067,995 B2 | 6/2006 | Gunter et al. |
| 7,088,059 B2 | 8/2006 | Mckinney et al. |
| 7,091,874 B2 | 8/2006 | Smithson |
| 7,213,940 B1 | 5/2007 | Van De Ven et al. |
| 7,233,831 B2 | 6/2007 | Blackwell |
| 7,307,391 B2 | 12/2007 | Shan |
| 7,352,138 B2 | 4/2008 | Lys et al. |
| 7,358,679 B2 | 4/2008 | Lys et al. |
| 7,427,838 B2 | 9/2008 | Hosoya |
| 7,432,668 B2 | 10/2008 | Zwanenburg et al. |
| 7,515,128 B2 | 4/2009 | Dowling |
| 7,568,815 B2 | 8/2009 | Lee et al. |
| 7,656,371 B2 | 2/2010 | Shimizu et al. |
| 7,812,553 B2 | 10/2010 | Kang et al. |
| 7,821,023 B2 | 10/2010 | Yuan et al. |
| 7,821,194 B2 | 10/2010 | Negley et al. |
| 7,994,725 B2 | 8/2011 | Bouchard |
| 2001/0032985 A1 | 10/2001 | Bhat et al. |
| 2002/0047624 A1 | 4/2002 | Stam et al. |
| 2002/0097095 A1 | 7/2002 | Jeon et al. |
| 2005/0280376 A1 | 12/2005 | Hamidian et al. |
| 2006/0244396 A1 | 11/2006 | Bucur |
| 2007/0040512 A1 | 2/2007 | Jungwirth et al. |
| 2007/0108843 A1 | 5/2007 | Preston et al. |
| 2007/0195023 A1 | 8/2007 | Kang et al. |
| 2007/0278934 A1* | 12/2007 | Van De Ven et al. ......... 313/503 |
| 2008/0024071 A1 | 1/2008 | Yu |
| 2008/0062070 A1 | 3/2008 | De Oto et al. |
| 2008/0122376 A1 | 5/2008 | Lys |
| 2008/0150440 A1 | 6/2008 | Hsu |
| 2008/0211415 A1 | 9/2008 | Altamura |
| 2008/0215279 A1 | 9/2008 | Salsbury et al. |
| 2008/0238335 A1 | 10/2008 | Lee et al. |
| 2009/0039791 A1 | 2/2009 | Jones |
| 2009/0140630 A1* | 6/2009 | Kijima et al. ................. 313/498 |
| 2010/0060175 A1 | 3/2010 | Lethellier |
| 2010/0123403 A1 | 5/2010 | Reed |
| 2010/0134018 A1 | 6/2010 | Tziony et al. |
| 2010/0141159 A1 | 6/2010 | Shiu et al. |
| 2010/0308738 A1 | 12/2010 | Shteynberg et al. |
| 2010/0308739 A1 | 12/2010 | Shteynberg et al. |
| 2011/0068696 A1 | 3/2011 | van de Ven et al. |
| 2011/0068702 A1 | 3/2011 | van de Ven et al. |

FOREIGN PATENT DOCUMENTS

| | | |
|---|---|---|
| JP | 2009-049010 A | 3/2009 |
| JP | 2009-123429 A | 6/2009 |
| WO | WO 2007/023454 A1 | 3/2007 |
| WO | WO 2009/093895 A1 | 8/2009 |

OTHER PUBLICATIONS

Cree® XLamp® XR-E LED Data Sheet. Cree, Inc. 2009 (retrieved on Jun. 8, 2011), Retrieved from the internet: URL:http://web.archive.org/web/20090206114628/http://cree.com/products/pdf/XLamp7090XR-E.pdf p. 2.

International Search Report Corresponding to International Application No. PCT/US2011/031081; Date of Mailing: Jun. 27, 2011; 12 pages.

Wood, Mike. "MacAdam Ellipses" *Out of the Wood*, Mike Wood Consulting LLC. (retrieved on Jun. 8, 2011). Retrieved from the internet: URL:http://www.mikewoodconsulting.com/articles/Protocol%20Fall%202010%20-%20MacAdam%20ellipses.pdf.

Sutardja, P., "Design for High Quality and Low Cost SSL with Power Factor Correction", Marvell Semiconductor Inc. Jul. 2011. 16 pages.

Extended European Search report corresponding to European application No. 10819249.3; Date of Mailing: Mar. 27, 2014, 8 pages.

Chinese Office Action Corresponding to Chinese Patent Application No. 201080053242.7; Date of Issue: Nov. 27, 2013; Foreign Text, 16 Pages, English Translation Thereof, 35 Pages.

* cited by examiner

METHODS FOR COMBINING LIGHT EMITTING DEVICES IN A WHITE LIGHT EMITTING APPARATUS THAT MIMICS INCANDESCENT DIMMING CHARACTERISTICS AND SOLID STATE LIGHTING APPARATUS FOR GENERAL ILLUMINATION THAT MIMIC INCANDESCENT DIMMING CHARACTERISTICS

FIELD OF THE INVENTION

The present invention relates to lighting, and more particularly to selecting and driving lighting components used in lighting assemblies and light emitting apparatus including selected lighting components.

BACKGROUND

For general illumination, it is desirable for lighting fixtures to be dimmable. Many control circuits for lighting use phase cut dimming. In phase cut dimming, a portion of the AC waveform, for example, the leading or trailing edge, is blanked ("cut") to reduce the RMS voltage provided to a lighting device. When used with incandescent lamps, this reduction in RMS voltage results in a corresponding reduction in average current and, therefore, a reduction in power consumption and light output. As the RMS voltage decreases, the light output from the incandescent lamp decreases.

Recently, solid state lighting systems have been developed that provide light for general illumination. These solid state lighting systems utilize light emitting diodes or other solid state light sources that are coupled to a power supply that receives the AC line voltage and converts that voltage to a voltage and/or current suitable for driving the solid state light emitters. Typical power supplies for light emitting diode light sources include linear current regulated supplies and/or pulse width modulated current and/or voltage regulated supplies.

Dimming circuits for solid state lighting components have been developed. However, it has been found that dimming a solid state lighting apparatus can cause the chromaticity of the light output by the apparatus to change.

Solid state devices, such as light emitting diode (LED) chips may be tested and grouped and/or binned according to their respective output and/or performance characteristics prior to being mounted in an LED package. The grouping may be performed using, for example, chromaticity values, such as the x, y values used in the CIE 1931 chromaticity diagram that was created by the International Commission on Illumination in 1931. In this manner, each light emitting device may be characterized by x, y coordinates. Emitters having similar x, y values may be grouped or binned to be used together, i.e., to be mounted together in a single LED package. LEDs and/or LED packages may be combined in a solid state lighting apparatus, and the combined light emitted by the LEDs in the apparatus defines the chromaticity of the light emitted by the apparatus. Typically, the chromaticity of the apparatus is specified as a design parameter, and it is undesirable for the chromaticity to change significantly during operation of the apparatus.

SUMMARY

A light emitting apparatus according to some embodiments includes a first light emitting device configured to emit light having a first chromaticity point that falls within a region on a 1931 CIE Chromaticity Diagram defined by points having coordinates (0.32, 0.40), (0.36, 0.48), (0.43, 0.45), (0.42, 0.42), (0.36, 0.38), and at least two second light emitting devices, each of the at least two second light emitting devices emits light having a respective second chromaticity points that fall below a line on the 1931 CIE Chromaticity Diagram defined by points having coordinates (0.4147, 0.3814) and (0.4593, 0.3944). A combined light emitted by the first light emitting device and the at least two second light emitting devices has a third chromaticity point that falls within a 7-step MacAdam ellipse around a point on the black body locus having a correlated color temperature between 2700K and 6500K.

The respective second chromaticity points may fall within a second region on the 1931 CIE Chromaticity Diagram defined by points having coordinates (0.4077, 0.3652), (0.4147, 0.3814), (0.4593, 0.3944), and (0.4492, 0.3772).

In some embodiments, the respective second chromaticity points fall within one of a plurality of second regions on the 1931 CIE Chromaticity Diagram denoted regions 7R, 7U, 8R and 8U. The 7R region is defined by points having coordinates (0.4077, 0.3652), (0.4147, 0.3814), (0.4259, 0.3853), and (0.4181), (0.3688) on the 1931 CIE Chromaticity Diagram, the 7U region is defined by points having coordinates (0.4181, 0.3688), (0.4259, 0.3853), (0.4373, 0.3893), and (0.4286, 0.3725) on the 1931 CIE Chromaticity Diagram, the 8R region is defined by points having coordinates (0.4373, 0.3893), (0.4483, 0.3919), (0.4389, 0.3748), (0.4286, 0.3725) on the 1931 CIE Chromaticity Diagram, and the 8U region is defined by points having coordinates (0.4483, 0.3919), (0.4593, 0.3944), (0.4492, 0.3772), (0.4389, 0.3748) on the 1931 CIE Chromaticity Diagram.

In some embodiments, the respective second chromaticity points have a ccx value greater than about 0.41 and a ccy value less than about 0.39 on the 1931 CIE Chromaticity Diagram.

The first and at least two second light emitting devices may include phosphor-coated blue light emitting device chips.

The third chromaticity point may be within a 7-step MacAdam ellipse of a point on the black body locus having a correlated color temperature between 3000K and 4000K.

The light emitting apparatus may further include a current supply coupled to the first light emitting device and a resistor in parallel with the first light emitting device.

A method of forming a light emitting apparatus according to some embodiments includes providing a substrate, mounting a first light emitting device configured to emit light having ccx, ccy color coordinates within an area on a 1931 CIE Chromaticity Diagram defined by points having coordinates (0.32, 0.40), (0.36, 0.48), (0.43, 0.45), (0.42, 0.42), (0.36, 0.38) on the substrate, and mounting at least two second light emitting devices on the substrate. Each of the at least two second light emitting devices emits light having a respective first chromaticity point that falls outside a 10-step MacAdam ellipse around any point on the black body locus and having a respective second chromaticity points that fall below a line on the 1931 CIE Chromaticity Diagram defined by points having coordinates (0.4147, 0.3814) and (0.4593, 0.3944) on the 1931 CIE Chromaticity Diagram on the package body. A combined light emitted by the first light emitting device and the at least two second light emitting devices has a second chromaticity point that falls within a 7-step MacAdam ellipse around any point on the black body locus having a correlated color temperature between 2700K and 6500K.

The respective second chromaticity points may fall within a second region on the 1931 CIE Chromaticity Diagram defined by points having coordinates (0.4077, 0.3652), (0.4147, 0.3814), (0.4593, 0.3944), and (0.4492, 0.3772).

In some embodiments, the respective second chromaticity points fall within one of a plurality of second regions on the 1931 CIE Chromaticity Diagram denoted regions 7R, 7U, 8R and 8U.

The respective second chromaticity points may have a ccx value greater than about 0.41 and a ccy value less than about 0.39 on the 1931 CIE Chromaticity Diagram.

The first and at least two second light emitting devices may include phosphor-coated blue light emitting device chips.

The third chromaticity point may be within a 7-step MacAdam ellipse of a point on the black body locus having a correlated color temperature between 3000K and 4000K.

The method may further include providing a current supply and a resistor on the substrate, and coupling the current supply to the first light emitting device.

The method may further include coupling a resistor in parallel with the first light emitting device.

A light emitting apparatus according to further embodiments includes a first light emitting device configured to emit light having a first chromaticity point that falls within a region on a 1931 CIE Chromaticity Diagram defined by points having coordinates (0.32, 0.40), (0.36, 0.48), (0.43, 0.45), (0.42, 0.42), (0.36, 0.38), and at least two second light emitting devices, each of the at least two second light emitting devices emits light having a respective second chromaticity points that falls outside a 7-step MacAdam ellipse around a point on the black body locus having a correlated color temperature between 2700K and 6500K. A combined light emitted by the first light emitting device and the at least two second light emitting devices has a third chromaticity point that falls within a 7-step MacAdam ellipse around a point on the black body locus having a correlated color temperature between 2700K and 6500K, and the third chromaticity shifts to a more reddish chromaticity when power to the light emitting devices is decreased.

The light emitting apparatus may further include a shunt resistor connected in parallel with the first light emitting device.

DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Some embodiments provide methods for combining light emitting devices in an apparatus that generates a pleasing, warm white light having a chromaticity that is close to the black body locus and that mimics dimming characteristics of incandescent light sources when dimmed, and apparatus including light emitting devices that generate warm white light and mimic incandescent dimming characteristics. Some embodiments further provide a light emitting apparatus that can advantageously utilize LEDs that have chromaticities that were previously thought to fall outside an acceptable range of chromaticities for white light emitting solid state lighting devices. Accordingly, systems/methods according to some embodiments can expand the range of devices that can be used in lighting apparatus for general illumination applications, which can more efficiently utilize manufactured LEDs.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
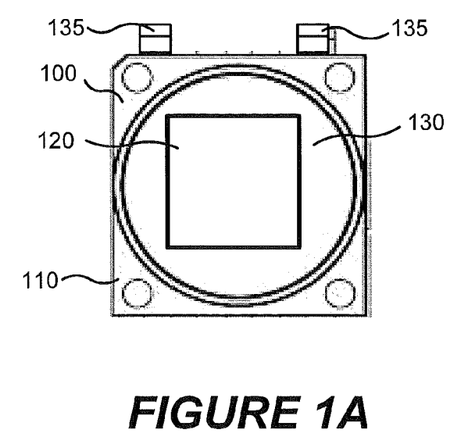
FIG. 1A is a plan view of a packaged light emitting diode according to some embodiments.
Figure 1B:
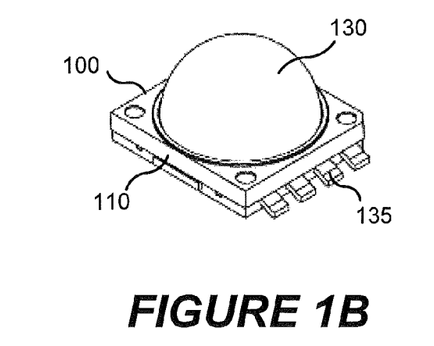
FIG. 1B is a perspective view of a packaged light emitting diode according to some embodiments.
Figure 1C:
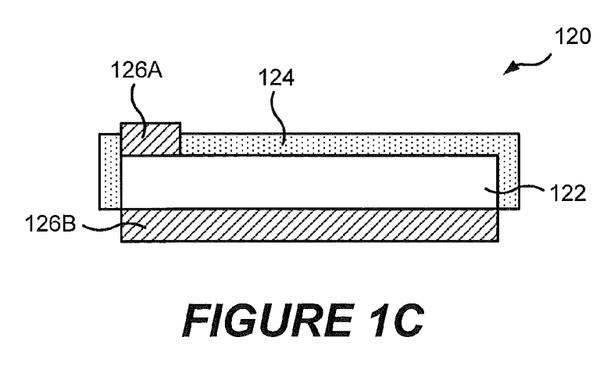
FIG. 1C illustrates an LED die that can be used in a packaged light emitting diode according to some embodiments.

Reference is now made to FIGS. 1A, 1B and 1C. FIG. 1A is a schematic plan view and FIG. 1B is a perspective view illustrating a light emitting device (LED) package 100 including one or more light emitting devices (or light emitters). FIG. 1C illustrates a light emitter 120 including an LED chip 122 that includes top and bottom anode/cathode contacts 126A, 126B and that is coated with a wavelength conversion phosphor 124 according to some embodiments. The LED package 100 may include a multi-chip module as described, for example, in U.S. patent application Ser. No. 12/154,691 filed May 23, 2008, the disclosure of which is incorporated herein by reference as if fully set forth herein in its entirety. In some embodiments, the light emitter 120 may have both anode and cathode contacts on the same side of the device. Accordingly, the present invention is not limited to devices including light emitters having a vertical device structure with anode and cathode contacts on opposite sides of the device.

In particular embodiments, the LED package 100 includes one or more light emitters 120 mounted within a package body 110. A lens 130 may be affixed over the light emitter 120 to provide a desired angular emission pattern of light from the light emitters 120, and/or to increase light extraction from the LED package 100. In some embodiments, the light emitter may be covered or coated with a wavelength conversion material, such as a phosphor, that converts at least a portion of light emitted by the light emitter 120 to a different wavelength or color. A plurality of electrical leads 135 provide electrical connection to the light emitter 120 in the package 100. If multiple light emitters 120 are included in the package 100, each of the light emitters 120 in the package 100 may be individually addressable. That is, the package may include separate anode/cathode leads from among the electrical leads 135 for each of the light emitters 120. Having individually addressable light emitters may permit the light emitters to be individually controlled, for example driven at different current levels, which may enable a lighting system to compensate for brightness variations among the light emitters in a given package 100 to achieve a desired color point.

In particular embodiments, the LED package 100 may include a multi-chip LED package, such as an MC-E LED available from Cree, Inc., the assignee of the present invention.

In particular embodiments, the LED package 100 may include one phosphor coated power LED chip having dimensions of about 1000 µm×1000 µm or more. Some embodiments provide a 7 mm×9 mm LED package including one 1.4 mm×1.4 mm phosphor coated power LED chip.

Some embodiments may provide binning and chip selection techniques for use in LED package manufacturing that may provide color-matched LEDs in solid state lighting apparatus. In particular, binning and device selection techniques according to some embodiments may permit the use of LEDs 100 that may fall outside standard bins and that would otherwise not be used.

In some embodiments, LEDs 100 may be grouped and/or selected for inclusion in a particular solid state lighting apparatus responsive to the combined chromaticity of the LEDs 100. Chromaticities of the LEDs 100 may be selected so that the combined light, that is a mixture of light from the LEDs 100, may have a desired chromaticity. In this manner, the perceived color of light generated by the solid state lighting apparatus may appear to have a desired chromaticity, e.g. white, based on the apparent chromaticity of the combination, even if none (or fewer than all) of the LEDs 100 individually emits light having the desired chromaticity.

Figure 2A:
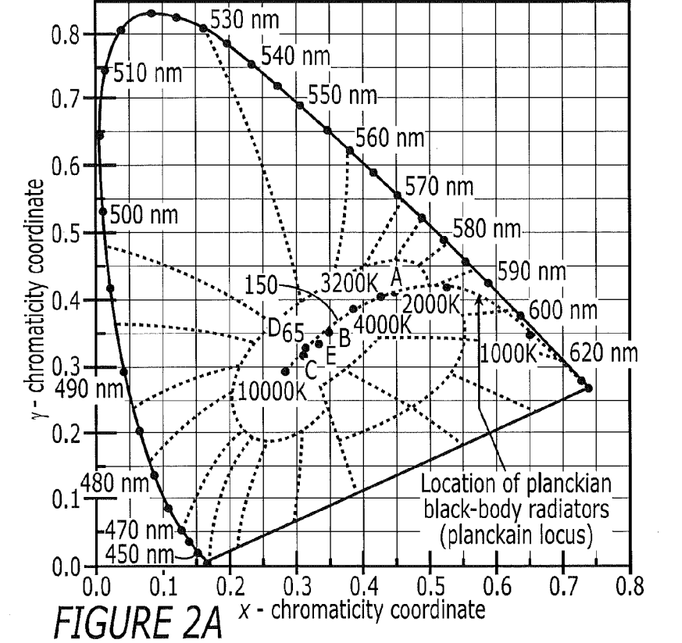
FIG. 2A is a 1931 CIE chromaticity diagram.

FIG. 2A illustrates a 1931 International Commission on Illumination (CIE) chromaticity diagram. The 1931 CIE Chromaticity diagram is a two-dimensional chromaticity space in which every visible color is represented by a point having x- and y-coordinates. Fully saturated (monochromatic) colors appear on the outer edge of the diagram, while less saturated colors (which represent a combination of wavelengths) appear on the interior of the diagram. The planckian locus, or black body locus (BBL), represented by line 150 on the diagram, follows the color an incandescent black body would take in the chromaticity space as the temperature of the black body changes from about 1000K to 10,000 K. The black body locus goes from deep red at low temperatures (about 1000 K) through orange, yellowish white, white, and finally bluish white at very high temperatures. The temperature of a black body radiator corresponding to a particular color in a chromaticity space is referred to as the "correlated color temperature." In general, light corresponding to a correlated color temperature (CCT) of about 2700 K to about 6500 K is considered to be "white" light. In particular, as used herein, "white light" generally refers to light having a chromaticity point that is within a 10-step MacAdam ellipse of a point on the black body locus having a CCT between 2700K and 6500K. However, it will be understood that tighter or looser definitions of white light can be used if desired. For example, white light can refer to light having a chromaticity point that is within a seven step MacAdam ellipse of a point on the black body locus having a CCT between 2700K and 6500K.

The light emitted by a light emitter 120 may be represented by a point on a chromaticity diagram, such as the 1931 CIE chromaticity diagram, having color coordinates denoted (ccx, ccy) on the X-Y axes of the diagram. A region on a chromaticity diagram may represent light emitters having similar chromaticity coordinates.

Figure 2B:
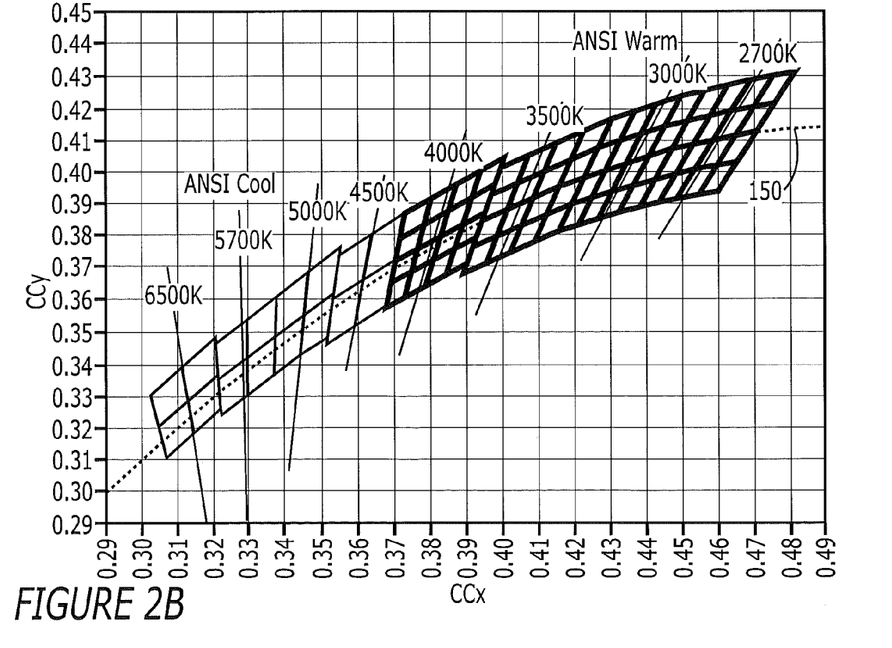
FIG. 2B illustrates portions of the 1931 CIE chromaticity diagram near the black body locus including ANSI defined bins.

The American National Standards Institute (ANSI) has proposed definitions of standard bins, or chromaticity regions, for white light around the black body locus. For example, FIG. 2B illustrates portions of the 1931 CIE chromaticity diagram near the black body locus including bins defined in accordance with proposed ANSI standard C78.377A for chromaticity of solid state light emitting devices. As shown therein, the ANSI bins are defined around the black body locus 150 from about 2700 K to about 6500 K.

Figure 3:
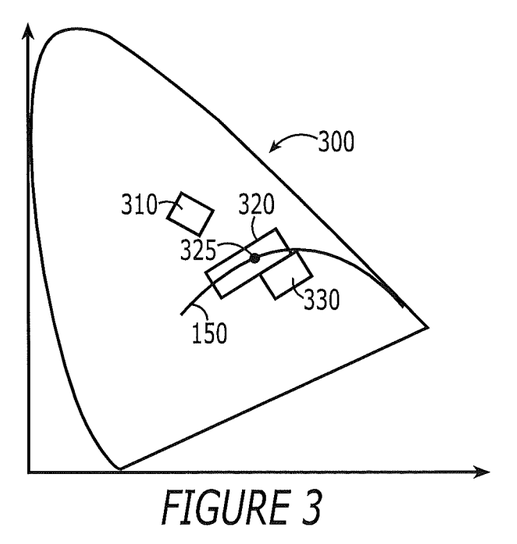
FIG. 3 is a chromaticity diagram illustrating a plurality of chromaticity regions corresponding to different groups of light emitters having similar chromaticity coordinates according to some embodiments.

FIG. 3 schematically illustrates selection and grouping of LEDs 100 according to some embodiments, as illustrated by various regions on a 1931 CIE chromaticity diagram 300. A solid state lighting apparatus according to some embodiments may emit white light. That is, the combined light emitted by the light emitters in the solid state lighting apparatus has a chromaticity that falls within a target chromaticity region 320 that is on or near the black body locus 150. The target chromaticity region 320 may include, for example, a bin defined in Table A1 of the proposed ANSI standard C78.377A and/or may include a custom defined bin. In general, the target chromaticity region 320 may have any desired shape, size, or location.

Figure 2C:
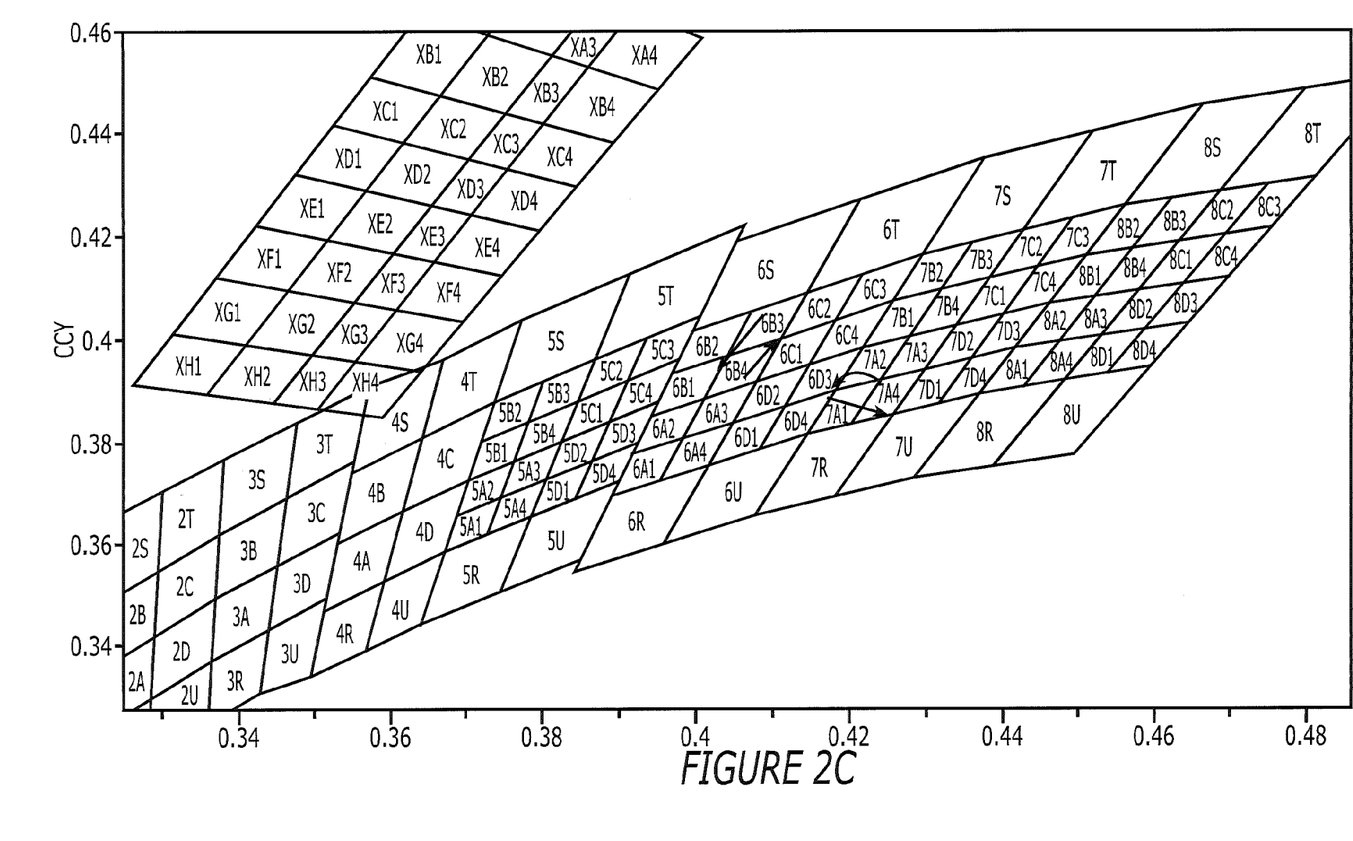
FIG. 2C is a graph that illustrates emitter group regions 3A-3D, 4A-4D, 5A-5D, 6A-6D, and 7A-7D.

In some embodiments, the target chromaticity region may include portions of regions 7A and 7B, is illustrated in FIG. 2C, on which emitter group regions 3A-3D, 4A-4D, 5A-5D, 6A-6D and 7A-7D are shown. Numeric definitions of the (x,y) coordinates of these emitter group regions are shown in the following Table:

TABLE 1

Emitter Group Regions 3A-3D to 8A-8D

| Region | x | y | Region | x | y | Region | x | y | Region | x | y |
|--------|--------|--------|--------|--------|--------|--------|--------|--------|--------|--------|--------|
| 3A | 0.3371 | 0.3490 | 3B | 0.3376 | 0.3616 | 3C | 0.3463 | 0.3687 | 3D | 0.3451 | 0.3554 |
|    | 0.3451 | 0.3554 |    | 0.3463 | 0.3687 |    | 0.3551 | 0.3760 |    | 0.3533 | 0.3620 |
|    | 0.3440 | 0.3428 |    | 0.3451 | 0.3554 |    | 0.3533 | 0.3620 |    | 0.3515 | 0.3487 |
|    | 0.3366 | 0.3369 |    | 0.3371 | 0.3490 |    | 0.3451 | 0.3554 |    | 0.3440 | 0.3428 |
| 4A | 0.3512 | 0.3465 | 4B | 0.3529 | 0.3597 | 4C | 0.3615 | 0.3659 | 4D | 0.3590 | 0.3521 |
|    | 0.3529 | 0.3597 |    | 0.3548 | 0.3736 |    | 0.3641 | 0.3804 |    | 0.3615 | 0.3659 |
|    | 0.3615 | 0.3659 |    | 0.3641 | 0.3804 |    | 0.3736 | 0.3874 |    | 0.3702 | 0.3722 |
|    | 0.3590 | 0.3521 |    | 0.3615 | 0.3659 |    | 0.3702 | 0.3722 |    | 0.3670 | 0.3578 |
| 5A | 0.3670 | 0.3578 | 5B | 0.3702 | 0.3722 | 5C | 0.3825 | 0.3798 | 5D | 0.3783 | 0.3646 |
|    | 0.3702 | 0.3722 |    | 0.3736 | 0.3874 |    | 0.3869 | 0.3958 |    | 0.3825 | 0.3798 |
|    | 0.3825 | 0.3798 |    | 0.3869 | 0.3958 |    | 0.4006 | 0.4044 |    | 0.3950 | 0.3875 |
|    | 0.3783 | 0.3646 |    | 0.3825 | 0.3798 |    | 0.3950 | 0.3875 |    | 0.3898 | 0.3716 |
| 6A | 0.3889 | 0.3690 | 6B | 0.3941 | 0.3848 | 6C | 0.4080 | 0.3916 | 6D | 0.4017 | 0.3751 |
|    | 0.3941 | 0.3848 |    | 0.3996 | 0.4015 |    | 0.4146 | 0.4089 |    | 0.4080 | 0.3916 |
|    | 0.4080 | 0.3916 |    | 0.4146 | 0.4089 |    | 0.4299 | 0.4165 |    | 0.4221 | 0.3984 |
|    | 0.4017 | 0.3751 |    | 0.4080 | 0.3916 |    | 0.4221 | 0.3984 |    | 0.4147 | 0.3814 |
| 7A | 0.4147 | 0.3814 | 7B | 0.4221 | 0.3984 | 7C | 0.4342 | 0.4028 | 7D | 0.4259 | 0.3853 |
|    | 0.4221 | 0.3984 |    | 0.4299 | 0.4165 |    | 0.4430 | 0.4212 |    | 0.4342 | 0.4028 |
|    | 0.4342 | 0.4028 |    | 0.4430 | 0.4212 |    | 0.4562 | 0.4260 |    | 0.4465 | 0.4071 |
|    | 0.4259 | 0.3583 |    | 0.4342 | 0.4028 |    | 0.4465 | 0.4071 |    | 0.4373 | 0.3893 |
| 8A | 0.4373 | 0.3893 | 8B | 0.4465 | 0.4071 | 8C | 0.4582 | 0.4099 | 8D | 0.4483 | 0.3919 |
|    | 0.4465 | 0.4071 |    | 0.4562 | 0.4260 |    | 0.4687 | 0.4289 |    | 0.4582 | 0.4099 |
|    | 0.4582 | 0.4099 |    | 0.4687 | 0.4289 |    | 0.4813 | 0.4319 |    | 0.4700 | 0.4126 |
|    | 0.4483 | 0.3919 |    | 0.4582 | 0.4099 |    | 0.4700 | 0.4126 |    | 0.4593 | 0.3944 |

According to some embodiments, the target chromaticity region may be defined by a standard, such as the ANSI C78.377A LED binning standard. Conventionally, to ensure that combined light emitted by a package falls within a standard chromaticity region, or bin, only light emitters that fall within the standard bin are chosen for inclusion within the package, and other light emitters that do not fall within the standard bin are discarded or ignored. However, some embodiments enable the selection and use of light emitters having chromaticity points that fall outside a standard bin to be used in a package that emits combined light having a chromaticity point within the standard bin. As used herein, a "bin" refers to a defined region of a chromaticity space. Typically, LEDs are sorted into defined bins for manufacturing purposes based on the chromaticity of light emitted by the LEDs, in a process referred to as "binning" In the ANSI C78.377A standard, bins are defined as quadrangles that encompass a 7-step MacAdam ellipse, which is the standard tolerance defined for compact fluorescent lamps by the Department of Energy Energy Star program. However, because the bins are defined as quadrangles, some chromaticity points that fall within the bin may nevertheless fall outside the 7 step MacAdam ellipse used to defined the bin. It will be appreciated that bins can be defined as shapes other than quadrangles. For example, bins could be defined as ellipses such as MacAdam ellipses, triangles, circles or any other geometric shape. Furthermore, bins can be defined in any color space, including a 1931 CIE (x,y) color space, a 1976 CIE (u',v') color space, or any other color space.

That is, a conventional white light emitting solid state lighting apparatus includes LEDs that emit light that falls within the target chromaticity region. The chromaticity point of the apparatus can be tuned, for example, by including saturated light emitters, such as red LEDs, in the apparatus, so that the combined light emitted by the apparatus has a warmer hue. However, choosing only white light emitters that have a chromaticity point within the target chromaticity region 320 may be inefficient as wasteful, as some of light emitters in a manufacturing run may have a chromaticity point that falls just outside the target chromaticity region. Such light emitters may be referred to as "near-white" LEDs, as they may have chromaticities that are nearly white, but that are distinguishable from white light by a human observer, because their light may fall outside a seven step MacAdam ellipse around any point on the black body locus.

Some near-white LEDs may fall into a near-white chromaticity region 330 that is generally below the target chromaticity region 320 and to the right of a target chromaticity point 325 within the target chromaticity region 320. Near white LEDs according to some embodiments may have chromaticity points that fall below a line on the 1931 CIE Chromaticity Diagram defined by points having coordinates (0.4147, 0.3814) and (0.4593, 0.3944). In some embodiments, the near-white LEDs may have chromaticity points that have a ccx value greater than about 0.4077 and a ccy value less than about 0.3944 on the 1931 CIE Chromaticity Diagram.

In some embodiments, the chromaticity region 330 may include one or more bins, including the 7R, 7U, 8R and 8U bins defined in Table 1, below.

TABLE 1

7R, 7U, 8R and 8U Regions

| Bin | ccx | ccy |
|---|---|---|
| 7R | 0.4077 | 0.3652 |
| 7R | 0.4147 | 0.3814 |
| 7R | 0.4259 | 0.3853 |
| 7R | 0.4181 | 0.3688 |
| 7U | 0.4181 | 0.3688 |
| 7U | 0.4259 | 0.3853 |
| 7U | 0.4373 | 0.3893 |
| 7U | 0.4286 | 0.3725 |
| 8R | 0.4373 | 0.3893 |
| 8R | 0.4483 | 0.3919 |
| 8R | 0.4389 | 0.3748 |
| 8R | 0.4286 | 0.3725 |
| 8U | 0.4483 | 0.3919 |
| 8U | 0.4593 | 0.3944 |
| 8U | 0.4492 | 0.3772 |
| 8U | 0.4389 | 0.3748 |

As shown in Table 1, the 7R region is defined by points having coordinates (0.4077, 0.3652), (0.4147, 0.3814), (0.4259, 0.3853), and (0.4181), (0.3688) on the 1931 CIE Chromaticity Diagram. The 7U region is defined by points having coordinates (0.4181, 0.3688), (0.4259, 0.3853), (0.4373, 0.3893), and (0.4286, 0.3725) on the 1931 CIE Chromaticity Diagram. The 8R region is defined by points having coordinates (0.4373, 0.3893), (0.4483, 0.3919), (0.4389, 0.3748), (0.4286, 0.3725) on the 1931 CIE Chromaticity Diagram, and the 8U region is defined by points having coordinates (0.4483, 0.3919), (0.4593, 0.3944), (0.4492, 0.3772), (0.4389, 0.3748) on the 1931 CIE Chromaticity Diagram.

Referring still to FIG. 3, a solid state lighting apparatus according to some embodiments may include a plurality of near-white light emitters in combination with at least one light emitter that has a chromaticity that falls within a non-white chromaticity region 310. Light from the near-white light emitters may combine with light from the non-white light emitters to produce combined light that has a chromaticity that falls within the target chromaticity region.

In particular, the non-white light emitters may have a chromaticity that falls within a non-white chromaticity region 310 that is generally above the target chromaticity region 320 and to the left of the target chromaticity point 325. In some embodiments, the non-white chromaticity region may fall within a region on a 1931 CIE Chromaticity Diagram defined by points having coordinates (0.32, 0.40), (0.36, 0.48), (0.43, 0.45), (0.42, 0.42), and (0.36, 0.38)), as described in detail in U.S. Pat. No. 7,213,940, the disclosure of which is incorporated herein by reference. Light falling in such a region may be yellowish green in hue, and may be referred to as "blue-shifted yellow" or BSY light.

In still further embodiments, the non-white chromaticity region may fall within regions on a 1931 CIE Chromaticity Diagram denoted XA and XB regions as defined in Table 2, below.

TABLE 2

XA and XB Regions

| Bin | ccx | ccy |
|---|---|---|
| XA | 0.3697 | 0.4738 |
| XA | 0.4008 | 0.4584 |
| XA | 0.3953 | 0.4487 |
| XA | 0.364 | 0.4629 |
| XB | 0.364 | 0.4629 |
| XB | 0.3953 | 0.4487 |
| XB | 0.3892 | 0.438 |
| XB | 0.3577 | 0.4508 |

That is, the XA region is defined by points having coordinates (0.3697, 0.4738), (0.4008, 0.4584), (0.3953, 0.4487), and (0.364, 0.4629), and the XB region is defined by points having coordinates (0.364, 0.4629), (0.3953, 0.4487), (0.3892, 0.438), and (0.3577, 0.4508).

Figure 4:
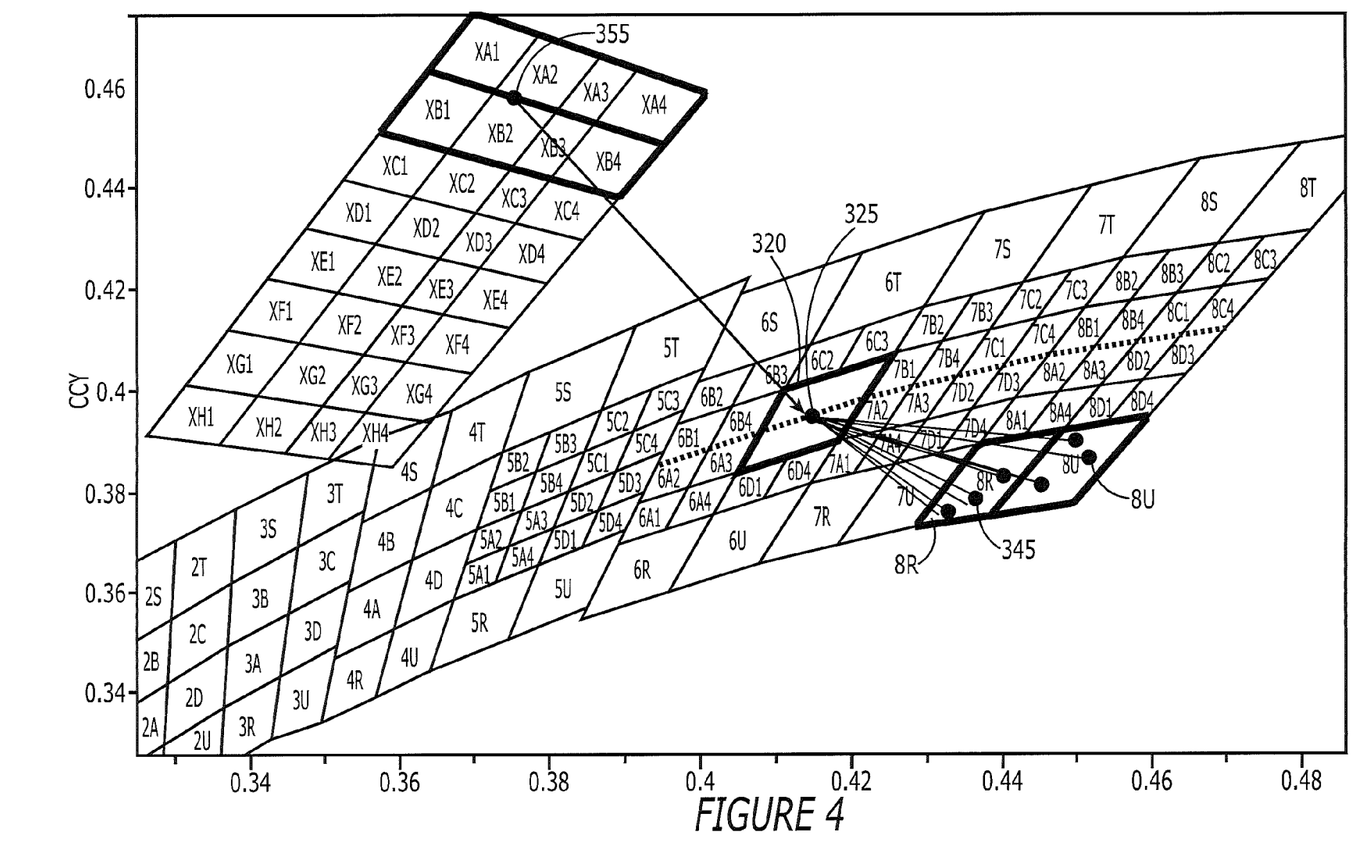
FIG. 4 illustrates portions of the 1931 CIE chromaticity diagram near the black body locus, including a target chromaticity region, non-white regions and near-white regions.

FIG. 4 illustrates portions of the 1931 CIE chromaticity diagram near the black body locus 150, including a target chromaticity region 320, non-white regions 310 and near-white regions 330. The non-white regions 310 include the XA and XB bins described above, while the near-white regions 330 include the 8U and 8R bins described above. In one example, a plurality of near-white light emitters having chromaticities 345 that fall within the 8R or 8U regions are combined in a solid state lighting apparatus with at least one non-white light emitter having a chromaticity that falls within the XA region, as illustrated in FIG. 4. The combined light of the light emitters, when energized, may have a chromaticity point 325 that is within the target chromaticity region 320.

The relative intensities of near-white light and non-white light in the solid state lighting apparatus can be selected to position the chromaticity point 325 of the combined light at a desired point between the near white region 330 and the non-white region 310. Because there are more near-white light emitters than non-white light emitters in this example, the total luminous flux generated by the near-white light emitters may be stronger than the total luminous flux generated by the non-white light emitters. Thus, the chromaticity point 325 of the combined light may be closer to the near white region 330 than to the non-white region 310.

Figure 5:
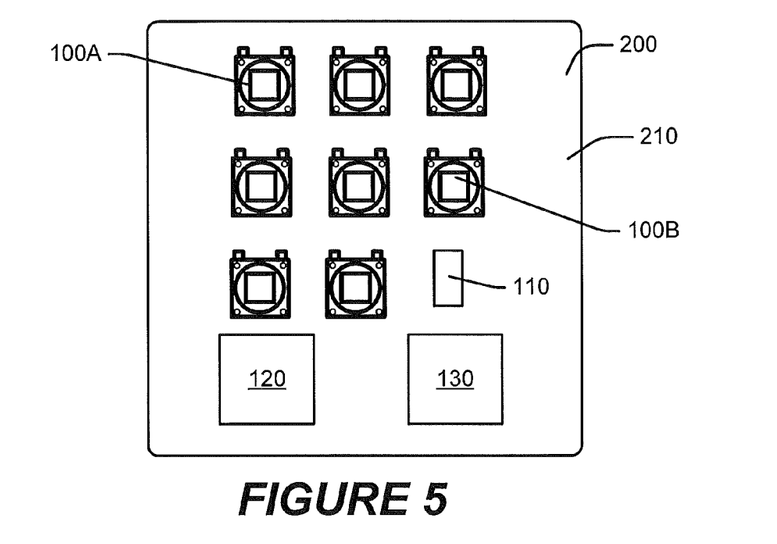
FIG. 5 is a plan view of a light emitting apparatus according to some embodiments.
Figure 6:
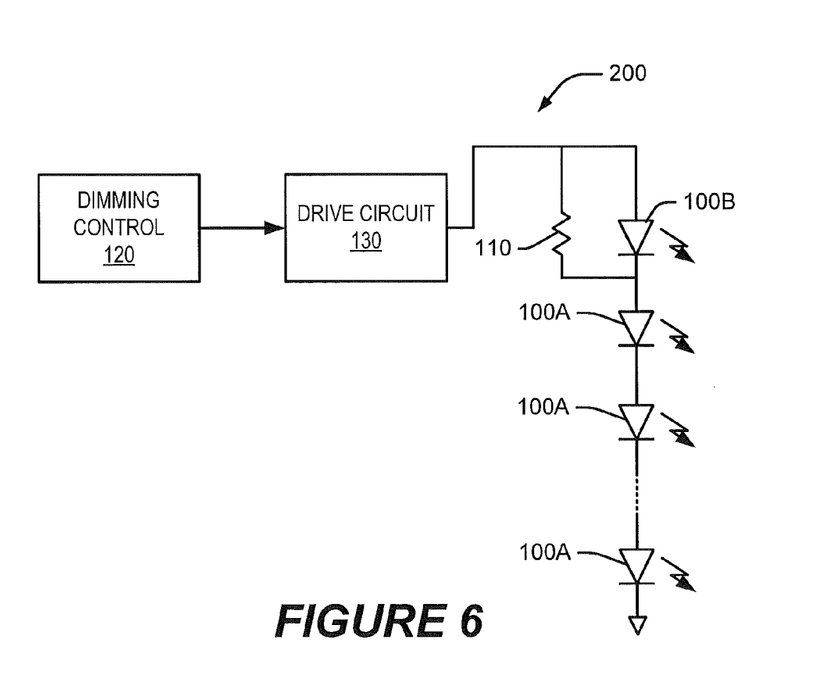
FIG. 6 is a schematic circuit diagram of a light emitting apparatus according to some embodiments.

FIG. 5 is a plan view and FIG. 6 is a schematic circuit diagram of a solid state light emitting apparatus 200 according to some embodiments. The light emitting apparatus 200 includes a plurality of near-white LEDs 100A and at least one non-white LED 100B mounted on a substrate 210, which may, for example, be a metal core printed circuit board (MCPCB). The plurality of near-white LEDs 100A may have chromaticities that fall within the 7R, 7U, 8R and/or 8U chromaticity regions as described above. The non-white LED 100B may have a chromaticity that falls within the XA or XB chromaticity regions as described above.

The solid state lighting apparatus 200 may further include a dimming control circuit 120 that controls current supplied to the LEDs 100A, 100B responsive to a dimming control signal, and a drive circuit 130 that supplies current to the LEDs 100A, 100B responsive to the dimming control circuit. The LEDs 100A, 100B may all be connected in electrical series, so that they may be driven by a common current generated by the drive circuit 130.

Dimming control circuits and drive circuits for LEDs in solid state lighting apparatus are known in the art. Suitable dimming control circuits are described, for example, in commonly assigned U.S. application Ser. No. 12/473,821, filed May 28, 2009, entitled "Power Source Sensing Dimming Circuits and Methods of Operating Same," the disclosure of which is incorporated herein by reference. Driver circuits for LEDs are disclosed, for example, in commonly assigned U.S. Publication No. 2009/0021180 entitled "LED With Integrated Constant Current Driver," the disclosure of which is incorporated herein by reference.

A shunt resistor 110 is provided in the solid state lighting apparatus 200. In particular, the shunt resistor may be provided in parallel with the non-white LED 100B. The shunt resistor may be provided to cause the light emitted by the solid state lighting apparatus 200 to become warmer, or more reddish, as the light from the apparatus is dimmed responsive to the dimming control signal, as discussed in more detail below. In some embodiments, the shunt resistor may have a resistance of about 50 ohms to about 100 ohms.

Figure 7:
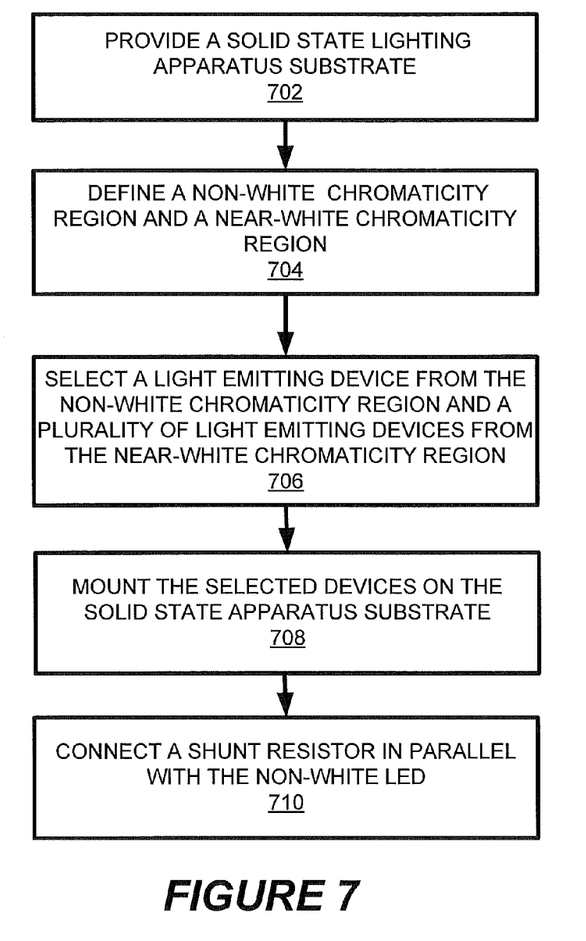
FIG. 7 is a flowchart illustrating operations of systems and/or methods according to some embodiments.

FIG. 7 is a flowchart illustrating operations of systems and/or methods according to some embodiments. As illustrated therein (with further reference to FIGS. 5 and 6), methods of forming a solid state lighting apparatus according to some embodiments include providing a solid state light emitting device substrate (Block 702), and defining a non-white chromaticity region and a near-white chromaticity region in a two dimensional chromaticity space (Block 704). In some embodiment, the non-white chromaticity region may correspond to the XA and/or XB chromaticity regions described above. The near-white chromaticity region may include chromaticity regions that fall below a line on the 1931 CIE Chromaticity Diagram defined by points having coordinates (0.4147, 0.3814) and (0.4593, 0.3944). In particular embodiments, the near-white chromaticity region may correspond to the 7R, 7U, 8R and/or 8U chromaticity regions as described above.

At least one LED is selected from the non-white chromaticity region and a plurality of LEDs are selected from the near-white chromaticity region (Block 706). The selected LEDs are mounted on the substrate (Block 708), and a shunt resistor is connected in parallel with the non-white LED (Block 710).

Figure 8:
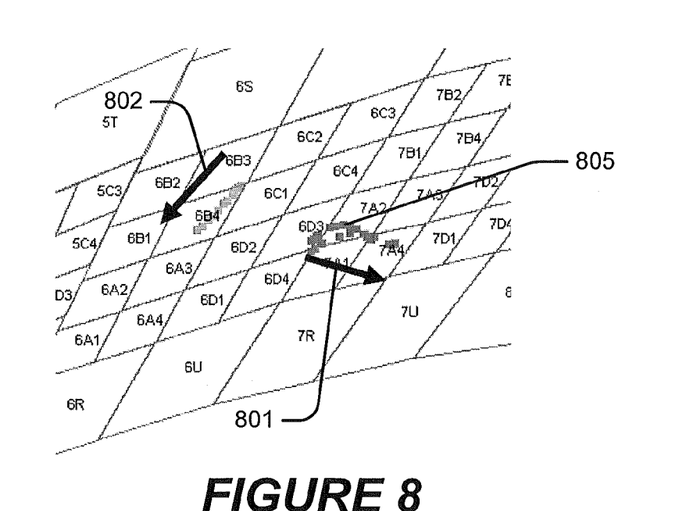
FIG. 8 shows portions of the 1931 CIE chromaticity diagram near the black body locus, and illustrates the effects of dimming a solid state lighting apparatus according to some embodiments.

FIG. 8 shows portions of the 1931 CIE chromaticity diagram near the black body locus including, and illustrates the effects of dimming a solid state lighting apparatus according to some embodiments. In particular, a solid state lighting apparatus according to some embodiments were formed according to the operations illustrated in FIG. 7. The apparatus included one non-white LED having a chromaticity selected from the XA chromaticity region described above and seven LEDs having chromaticities selected from the 7U and 7R chromaticity regions as described above. The apparatus was provided with 50 ohm and 100 ohm shunt resistors 110 and run at various power levels, and the chromaticity of light emitted by the solid state lighting apparatus was measured with an integrating sphere to measure the effects of dimming the apparatus. In particular, the apparatus was powered at a maximum power of 12 watts down to a minimum power of 2.5 watts, with the chromaticity measured at various increments between 12 watts and 2.5 watts.

A plurality of chromaticity points 805 of the solid state lighting apparatus are illustrated in FIG. 8. The chromaticity points 805 generally fall within the 6D and 7A chromaticity regions as described above, and would therefore generally be considered white light. A first arrow 801 in FIG. 8 indicates the direction of movement of the chromaticity of light emitted by the solid state lighting apparatus as the power supplied to the apparatus was decreased (i.e., as the light was dimmed). The first arrow 801 indicates that the chromaticity of the solid state lighting apparatus moved generally to the right, i.e., to a more reddish color, with increased dimming. That is, the ccx value of the chromaticity increased as the device was dimmed. This characteristic mimics the dimming characteristics of incandescent lights, in that the light output becomes more reddish as the light is dimmed, and may provide a more pleasing light to an observer, and/or may have a higher color rendering index.

In contrast, a conventional white light emitting solid state lighting device that uses saturated red LEDs to enhance warmth may have a chromaticity that becomes more greenish/bluish when the light is dimmed, as indicated by the second arrow 802 in FIG. 8. Greenish and/or bluish light may be less desirable, as it is less "warm" and may cause objects illuminated by the light to appear discolored.

Figure 9:
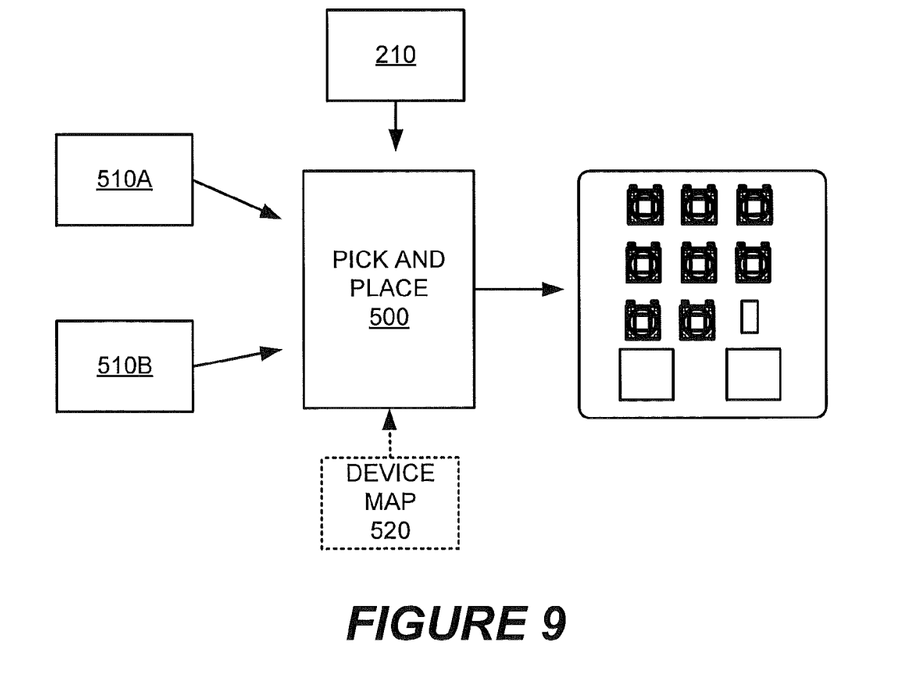
FIG. 9 schematically illustrates a system for assembling solid state lighting apparatus according to some embodiments.

A system for assembling a solid state light emitting apparatus according to some embodiments is illustrated in FIG. 9. As shown therein, a pick and place device 500 is configured to accept a plurality of LED sheets 510A and 510B. The LED sheets 510A and 510B include LEDs 100A and 100B that emit light that falls within either the non-white chromaticity region as described above or a near-white chromaticity region as described above.

In some embodiments, the pick and place device 500 may accept a LED sheet 510A that includes light emitters from both the non-white and near-white chromaticity regions along with an electronic device map 520 containing information about the chromaticities of the various LEDs on the LED sheet 510A.

The pick and place device 500 also receives a plurality of substrates 210 bodies 110, for example on a tape reel. The pick and place device 500 may select a plurality of near-white LED 100A and at least one non-white LED 100B from the LED sheets 510A, 510B and mount them on a single substrate 210. The substrate 210 including the LEDs 100A, 100B is then output by the pick and place device 500 to a subsequent processing device, for example, to mount the dimming control circuit 12, the drive circuit 130, and/or the shunt resistor 110 on the substrate, or to perform some other action.

Accordingly, a manufacturing process according to some embodiments can facilitate efficient assembly of solid state lighting apparatus 200 that includes LEDs 100A, 100B selected to generate a combined light that falls within a target chromaticity region.

Figure 10:
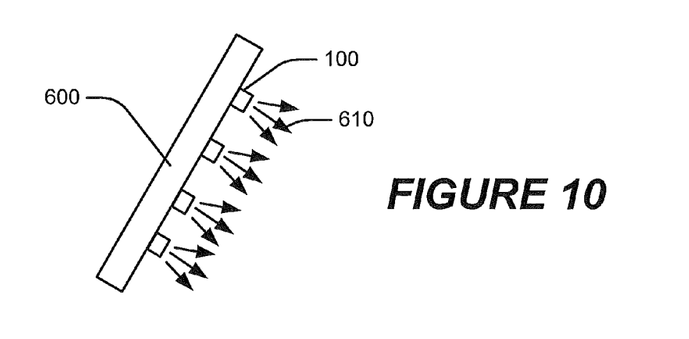
FIG. 10 illustrates a lighting panel for general illumination including a solid state lighting apparatus according to some embodiments.

FIG. 10 illustrates a lighting panel for general illumination including a solid state lighting apparatus according to some embodiments.

Referring to FIG. 10, a lighting panel 600 includes a solid state lighting apparatus 200 as described herein that are mounted on a first side of the panel 600 and that emit light combined 610 having a chromaticity within a target chromaticity region for use in general lighting applications.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A light emitting apparatus, comprising:
a first light emitting device configured to emit light having a first chromaticity point that falls within a region on a 1931 CIE Chromaticity Diagram that is within a 7-step MacAdam ellipse around any point in a space defined by points having coordinates (0.32, 0.40), (0.36, 0.48), (0.43, 0.45), (0.42, 0.42), (0.36, 0.38); and
at least two second light emitting devices, wherein each of the at least two second light emitting devices emits light having a respective second chromaticity points that have ccx values greater than 0.4077 and ccy values less than 0.3944 on the 1931 CIE Chromaticity Diagram;
wherein a combined light emitted by the first light emitting device and the at least two second light emitting devices has a third chromaticity point that falls within a 7-step MacAdam ellipse around a point on the black body locus having a correlated color temperature between 2700K and 6500K; and wherein the respective second chromaticity points fall within a second region on the 1931 CIE Chromaticity Diagram defined by points having coordinates (0.4077, 0.3652), (0.4147, 0.3814), (0.4593, 0.3944), and (0.4492, 0.3772).

2. The light emitting apparatus of claim 1, wherein the respective second chromaticity points fall below a line on the 1931 CIE Chromaticity Diagram defined by points having coordinates (0.4147, 0.3814) and (0.4593, 0.3944).

3. The light emitting apparatus of claim 1, wherein the respective second chromaticity points fall outside a 7-step MacAdam ellipse around any point on the black body locus.

4. The light emitting apparatus of claim 1, wherein the respective second chromaticity points fall within one of a plurality of second regions on the 1931 CIE Chromaticity Diagram denoted regions 7R, 7U, 8R and 8U;
wherein the 7R region is defined by points having coordinates (0.4077, 0.3652), (0.4147, 0.3814), (0.4259, 0.3853), and (0.4181), (0.3688) on the 1931 CIE Chromaticity Diagram;
the 7U region is defined by points having coordinates (0.4181, 0.3688) (0.4259, 0.3853), (0.4373, 0.3893), and (0.4286, 0.3725) on the 1931 CIE Chromaticity Diagram;
the 8R region is defined by points having coordinates (0.4373, 0.3893), (0.4483, 0.3919), (0.4389, 0.3748), (0.4286, 0.3725) on the 1931 CIE Chromaticity Diagram; and
the 8U region is defined by points having coordinates (0.4483, 0.3919), (0.4593, 0.3944), (0.4492, 0.3772), (0.4389, 0.3748) on the 1931 CIE Chromaticity Diagram.

5. The light emitting apparatus of claim 1, wherein the first and at least two second light emitting devices comprise phosphor-coated blue light emitting device chips.

6. The light emitting apparatus of claim 1, wherein the third chromaticity point is within a 7-step MacAdam ellipse of a point on the black body locus having a correlated color temperature between 3000K and 4000K.

7. The light emitting apparatus of claim 1, further comprising a current supply coupled to the first light emitting device and a resistor in parallel with the first light emitting device.

8. A lighting fixture including a light emitting apparatus as recited in claim 1.

9. A method of forming a light emitting apparatus, comprising:
providing a substrate;
mounting a first light emitting device configured to emit light having ccx, ccy color coordinates within an area on a 1931 CIE Chromaticity Diagram defined by points having coordinates (0.32, 0.40), (0.36, 0.48), (0.43, 0.45), (0.42, 0.42), (0.36, 0.38) on the substrate; and mounting at least two second light emitting devices on the substrate, wherein each of the at least two second light emitting devices emits light having a respective first chromaticity point that falls outside a 10-step MacAdam ellipse around any point on the black body locus and having a respective second chromaticity points that have ccx values greater than 0.4077 and ccy values less than 0.3944 on the 1931 CIE Chromaticity Diagram on the package body;

wherein a combined light emitted by the first light emitting device and the at least two second light emitting devices has a second chromaticity point that falls within a 7-step MacAdam ellipse around any point on the black body locus having a correlated color temperature between 2700K and 6500K; and wherein the respective second chromaticity points fall within a second region on the 1931 CIE Chromaticity Diagram defined by points having coordinates (0.4077, 0.3652), (0.4147, 0.3814), (0.4593, 0.3944), and (0.4492, 0.3772).

10. The method of claim 9, wherein the respective second chromaticity points fall within one of a plurality of second regions on the 1931 CIE Chromaticity Diagram denoted regions 7R, 7U, 8R and 8U;
wherein the 7R region is defined by points having coordinates (0.4077, 0.3652), (0.4147, 0.3814), (0.4259, 0.3853), and (0.4181), (0.3688) on the 1931 CIE Chromaticity Diagram;
the 7U region is defined by points having coordinates (0.4181, 0.3688), (0.4259, 0.3853), (0.4373, 0.3893), and (0.4286, 0.3725) on the 1931 CIE Chromaticity Diagram;
the 8R region is defined by points having coordinates (0.4373, 0.3893), (0.4483, 0.3919), (0.4389, 0.3748), (0.4286, 0.3725) on the 1931 CIE Chromaticity Diagram; and
the 8U region is defined by points having coordinates (0.4483, 0.3919), (0.4593, 0.3944), (0.4492, 0.3772), (0.4389, 0.3748) on the 1931 CIE Chromaticity Diagram.

11. The method of claim 9, wherein the respective second chromaticity points have a ccx value greater than about 0.41 and a ccy value less than about 0.39 on the 1931 CIE Chromaticity Diagram.

12. The method of claim 9, wherein the first and at least two second light emitting devices comprise phosphor-coated blue light emitting device chips.

13. The method of claim 9, wherein the third chromaticity point is within a 7-step MacAdam ellipse of a point on the black body locus having a correlated color temperature between 3000K and 4000K.

14. The method of claim 9, further comprising providing a current supply and a resistor on the substrate, and coupling the current supply to the first light emitting device.

15. The method of claim 9, further comprising coupling a resistor in parallel with the first light emitting device.

* * * * *

UNITED STATES PATENT AND TRADEMARK OFFICE
CERTIFICATE OF CORRECTION

PATENT NO.       : 8,950,892 B2                                      Page 1 of 1
APPLICATION NO.  : 13/050110
DATED            : February 10, 2015
INVENTOR(S)      : Cash It is certified that error appears in the above-identified patent and that said Letters Patent is hereby corrected as shown below:

In the Claims:

Column 13, Claim 9, Line 53: Please correct "cry" to read -- ccy --

Column 14, Claim 9, Line 7: Please correct "cry" to read -- ccy --

Signed and Sealed this
Sixteenth Day of June, 2015

Michelle K. Lee
*Director of the United States Patent and Trademark Office*